US006738961B2

United States Patent
Snider

(10) Patent No.: US 6,738,961 B2
(45) Date of Patent: May 18, 2004

(54) COMPUTER READABLE MEDIUM AND A METHOD FOR REPRESENTING AN ELECTRONIC CIRCUIT AS A ROUTING-RESOURCE GRAPH

(75) Inventor: Gregory Stuart Snider, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 14 days.

(21) Appl. No.: 10/084,383

(22) Filed: Feb. 28, 2002

(65) Prior Publication Data

US 2003/0163796 A1 Aug. 28, 2003

(51) Int. Cl.[7] .................... G06F 17/50; G06F 9/00; G06F 7/04
(52) U.S. Cl. .................. 716/16; 716/18; 713/2; 713/100; 707/102; 707/101; 709/221; 709/222; 703/16
(58) Field of Search .................. 716/16, 18, 13, 716/14; 713/2, 100; 707/101, 102; 709/221, 222; 703/16

(56) References Cited

U.S. PATENT DOCUMENTS

| 5,519,629 | A | * | 5/1996 | Snider | 716/17 |
| 5,598,346 | A | * | 1/1997 | Agrawal et al. | 716/16 |
| 5,640,327 | A | * | 6/1997 | Ting | 716/7 |
| 5,659,484 | A | * | 8/1997 | Bennett et al. | 716/16 |

(List continued on next page.)

FOREIGN PATENT DOCUMENTS

| EP | 319232 A2 | * | 6/1989 | ........... G06F/15/40 |
| GB | 2149989 A | * | 6/1985 | ........... H03K/19/00 |
| WO | WO 9833182 A1 | * | 7/1998 | ........... G11C/8/00 |

OTHER PUBLICATIONS

NB9404331, "Sharing Application Control Data in the Parallel Database Manager", IBM Technical Disclosure Bulletin, Vo. 37, No. 4B, Apr. 1994, pp. 331–332 (5 pages).*
Brown et al., "A Detailed Router for Field–Programmable Gate Arrays", 1990 IEEE International Conference on Computer–Aid Design, Nov. 11, 1990, pp. 382–385.*
Wu et al., "Graph Based Analysis of FPGA Routing", Proceedings of European Design Automation Conference, 1993, with EURO–VHDL, Sep. 20, 1993, pp. 104–109.*
Chang et al., "FPGA Global Routing Based on a New Congestion Metric", Proceedings of 1995 IEEE International Conferenc on Computer Design: VLSI in Computers and Process, Oct. 2, 1995, pp. 372–378.*
Chrzanowska–Jeske et al., "Partitioning Approach to Find an Exact Solution to Fitting Problem in an Application–Specific EPLD Device", Proceedings of Design Automation Conference, 1993, with Euro–VHDL '93, Sep. 20, 1993, pp. 39–44.*

(List continued on next page.)

Primary Examiner—Matthew Smith
Assistant Examiner—Phallaka Kik

(57) ABSTRACT

A computer readable medium containing a computer program for representing an electronic circuit, which has been segmented into plurality blocks, as a routing-resource graph includes a first wiring data structure with first switch information and a first wire identity information to identify a first wire across a first plurality of blocks, a second wiring data structure with the first switch information and a second wire identity information to identify a second wire across a second plurality of blocks, and a first switch data structure having wire information and associated with the first and second wiring data structures for identifying a third wire connected to the first wire with a switch as a function of the first wire identity information and wire information from the first switch data structure.

18 Claims, 2 Drawing Sheets

U.S. PATENT DOCUMENTS

| | | | | |
|---|---|---|---|---|
| 5,740,069 | A | * 4/1998 | Agrawal et al. | 716/16 |
| 5,761,729 | A | * 6/1998 | Scales | 711/148 |
| 5,835,751 | A | * 11/1998 | Chen et al. | 716/16 |
| 5,850,537 | A | * 12/1998 | Selvidge et al. | 716/12 |
| 5,959,871 | A | * 9/1999 | Pierzchala et al. | 703/4 |
| 5,960,446 | A | * 9/1999 | Schmuck et al. | 707/205 |
| 6,052,688 | A | * 4/2000 | Thorsen | 707/100 |
| 6,086,631 | A | * 7/2000 | Chaudhary et al. | 716/16 |
| 6,099,583 | A | * 8/2000 | Nag | 716/16 |
| 6,128,770 | A | * 10/2000 | Agrawal et al. | 716/17 |
| 6,317,804 | B1 | * 11/2001 | Levy et al. | 710/305 |
| 6,360,191 | B1 | * 3/2002 | Koza et al. | 703/6 |
| 6,536,018 | B1 | * 3/2003 | Chisholm et al. | 716/4 |
| 6,584,601 | B1 | * 6/2003 | Kodosky et al. | 716/4 |
| 2002/0157066 | A1 | * 10/2002 | Marshall et al. | 716/1 |
| 2003/0028852 | A1 | * 2/2003 | Thurman et al. | 716/12 |
| 2003/0088843 | A1 | * 5/2003 | Mehrotra et al. | 716/12 |

OTHER PUBLICATIONS

Ejnioui et al., "Routing on Switch Matric Multi–FPGA Systems", Thirteen International Conference on VLSI Design, Jan. 3, 2000, pp. 248–253.*

Sun et al., "Routing for Symmetric FPGAs and FPICs", 1993 IEEE/ACM International Conference on Computer–Aided Design, Nov. 1993, pp. 486–490.*

Hauck et al., "Mesh Routing Topologies for Multi–FPGA Systems", Proceedings of IEEE International Conference on Comput r Design: VLSI in Computers and Process, Oct. 10, 1994, pp. 170–177.*

Wu et al., "Not Necessarily More Switches Mor Routability", Proceedings of the ASP–DAC '97 Asia and South Pacific Design Automation Conferenc , Jan. 28, 1997, pp. 579–584.*

Chang et al., "A Graph–Theoretic Sufficient Condition for FPGA/FPIC Switch–Module Routability", Proceedings of 1997 IEEE International Symposium on Circuits and Systems, Jun. 9, 1997, vol. 3, pp. 1572–1575.*

Wang et al., "Graph–Based Detailed Router for Hierarchical Field–Programmable Gate Arrays", IEE Proceedings of Computers and Digital Techniques, vol. 146, No. 1, Jan. 1999, pp. 57–67.*

Alexander et al., "High–Performance Routing for Field–Programmable Gate Arrays", Proceedings of Seventh Annual IEEE International ASIC Conference and Exhibit, Sep. 19, 1994, pp. 138–141.*

Wu et al., "Graph Bas d Analysis of 2–D FPGA Routing", IEEE Transactions on Computer–Aided Design of Int grated Circuits and Systems, vol. 15, No. 1, Jan. 1996, pp. 33–44.*

1. Vaughn Betz et al.; Architecture and CAD for Deep–Submicron FPGAs; Routing Tools and Routing Architecture Generation; Chapter 4; pp. 68–70; Kluwer Academic Publishers; Boston/Dordrecht/London, 1999.

2. Larry McMurchie et al.; Pathfinder: A Negotiation Based Performance–Driven Router for FPGAs; 7 pages; Department of Computer Science and Engineering, University of Washington, Seattle, Washington, Proceedings of 1995 ACM Third International Symposium on Field Programmable Gate Arrays, Feb. 1995, pp. 111–117.

* cited by examiner

COMPUTER READABLE MEDIUM AND A METHOD FOR REPRESENTING AN ELECTRONIC CIRCUIT AS A ROUTING-RESOURCE GRAPH

BACKGROUND OF THE INVENTION

1. Field of the Invention

The invention relates to the data structures for representing an electronic circuit, and more particularly, the invention relates to a computer readable medium and a method of describing data structures for representing an electronic circuit as a routing-resource graph.

2. Background Information

Programmable Circuit Arrays ("PCA") can be programmed to define desired routing paths. A field programmable gate array ("FPGA") is a PCA comprising configurable logic elements and a programmable routing network. The routing network and logic elements exhibit a regularity, such as a tiling of a small number of different types of subcomponents creating large mosaics of regular programmable structure. A user's design can be mapped onto an FPGA by selecting and configuring appropriate logic elements and interconnecting them, along with FPGA inputs and outputs, using the routing network and a suitable programming of the routing network which has been derived using a "router."

An exemplary routing structure has horizontal and vertical lines representing wires or metal traces within the FPGA capable of carrying signals throughout the FPGA chip. At the intersection of a horizontal and vertical line, a programmable switch "x" can be configured to either connect the wires represented by the underlying horizontal vertical lines ("closed") or to leave them unconnected ("open"). Inputs and outputs to the FPGA are represented as small squares, and configurable function units are represented as labeled rectangles. Closing appropriate switches will create an effective circuit within the FPGA, interconnecting desired inputs, outputs (i.e., squares) and functions units (i.e., rectangles). A a single "cell" or "tile" (composed of a function unit, several wire segments, and switches) can be replicated and abutted many times to create the FPGA.

To create a router that is independent of any specific FPGA architecture and usable for multiple FPGA targets, a routing-resource graph, or similar structure, is used to represent the routing network within the FPGA. As referenced herein, a "routing-resource graph" is any structural representation wherein a node is used to represent a wire, input, output, or pin on a logic block; a directed edge is used to represent a unidirectional switch (e.g. a programmable buffer) and a pair of directed edges are used to represent a bidirectional switch (e.g. a pass transistor). As referenced herein, a routing-resource graph can be used to represent an arbitrary routing architecture, such that a general-purpose router can configured independent of any particular FPGA architecture. After creating a routing-resource graph for a desired FPGA target, a general purpose router can route a user's design onto the FPGA. A routing-resource graph can also map onto object-oriented programming, allowing the use of instances of a "Switch" class and a "Wire" class to represent the routing network in an FPGA.

A routing-resource graph can require large memory. For example, an FPGA can have hundreds of thousands or wires, and tens of millions of switches, and these numbers will only increase as technology advances. Representing such a current FPGA with a straightforward resource-routing graph implementation can several gigabytes or more of memory.

It is known to exploit the regularity of a routing architecture to trade-off computation for memory. For example, consider the routing of a signal from a horizontal wire H0 starting in cell (0, 0) to a desired target vertical wire Vf. From a switch table, a router can deduce that there are two switches in the current cell (0, 0) potentially connecting to vertical wires V0 and V1. By calling a first function (i.e., a first method call) for the first switch, the router finds that the first switch leads to a wire Va, and by calling the first function for the second switch, the router finds that the second switch leads to a wire Vb, neither of which is the desired target vertical wire Vf. The router proceeds along wire H0 to the next cell to the right, (1, 0), taking into account any twist in the horizontal wire bus between the two cells (0, 0) and (1, 0). In cell (1, 0), the same wire thus has the local name H1. Again by calling the first function, the router can discover that the second switch within cell (1, 0) leads to the desired target wire Vf.

A compute based approach is an effective alternative to the resource routing graph, and is used in the JRoute code supplied with the JBits system offered by Xilinx. The advantage is that much less memory is needed to represent the switched connectivity. For example, instead of the 54 instances of Switch data structures used in a typical routing-resource graph, a small switch table plus some easily written functions will suffice. Memory savings can be more dramatic in an FPGA comprising tens of thousands of cells. However, the internal structures of the FPGA have to be exposed to the router so that it can be used to navigate the routing network. A router written at this level can not be easily adapted to a different FPGA architecture.

SUMMARY OF THE INVENTION

The present invention relates to efficiently representing an electronic circuit array as a routing-resource graph using reduced memory (e.g., use of a Flyweight Design Pattern with a computation based approach).

In accordance with an exemplary embodiment of the present invention, a computer readable medium containing a computer program is provided for representing an electronic circuit, which has been segmented into plural blocks, as a routing-resource graph that includes a first wiring data structure with first switch information and a first wire identity information to identify a first wire across a first plurality of blocks, a second wiring data structure with the first switch information and a second wire identity information to identify a second wire across a second plurality of blocks, and a first switch data structure associated with the first and second wiring data structures for identifying a third wire connected to the first wire with a switch as a function of the first wire identity information and wire information from the first switch data structure.

In accordance with another exemplary embodiment of the present invention, a method for representing an electronic circuit as a routing-resource graph includes defining a plurality of blocks each having a regular sub-array of switches and wires, defining a first wiring data structure with first switch information and first wire identity information to identify a first wire, defining a second wiring data structure with first switch information and second wire identity information to identify a second wire, and defining a first switch data structure having wire information and associated with the first and second wiring data structures for identifying wires respectively connected to the first and second wires by a switch as a function of wire identity information and the wire information.

BRIEF DESCRIPTION OF THE DRAWINGS

The invention will now be described in greater detail with reference to a preferred embodiment illustrated in the accompanying drawings, in which like elements bear like reference numerals, and wherein.

DETAILED DESCRIPTION OF THE PREFERRED EMBODIMENTS

The present invention is directed to representing an electronic circuit, which has been segmented into plural blocks that each have positional coordinates, as a routing-resource graph. Data structures can be stored as a computer program on a computer readable medium. The data structures include a first wiring data structure with first switch (i.e., 103/107/111) information and a first wire identity information to identify a first wire, for example Ha in FIG. 1, across a first plurality of blocks, such as 102/104/106 in FIG. 1. The data structures include a second wiring data structure with the first switch information and a second wire identity information to identify a second wire, for example Hd in FIG. 1, across a second plurality of blocks, such as 108/110/112 in FIG. 1. The data structures also include a first switch data structure for the first switch (i.e., 103/107/111) information associated with the first and second wiring data structures for identifying a third wire, for example Vb connected to the first wire with a switch as a function of the first wire identity information and wire information from the first switch data structure.

Memory usage can be reduced based on use of a Flyweight design pattern with a compute-based approach to produce a shared routing-resource graph that appears to the router to be an ordinary routing-resource graph, but that internally uses less memory when used to represent the routing network of an FPGA with a regular structure. A Flyweight design pattern is used in object-oriented applications where it is desirable to use the same data structures throughout a design. The data structures are shared in that a single data structure may be reference in multiple contexts, with each reference treated as though it were referencing a distinct, unique data structure. The shared data structure has two aspects that are used to accomplish this. The first aspect is the intrinsic state of the shared data structure stored in the shared data structure, which is independent of context and makes the data structure shareable. The second aspect is the extrinsic state of the shared data structure that depends on the context in which the data structure is used, and therefore cannot be stored in the shared data structure. An application of the design can pass the extrinsic state from another data structure to the shared data structure in order to give the share data structure the proper context.

Figure 1:
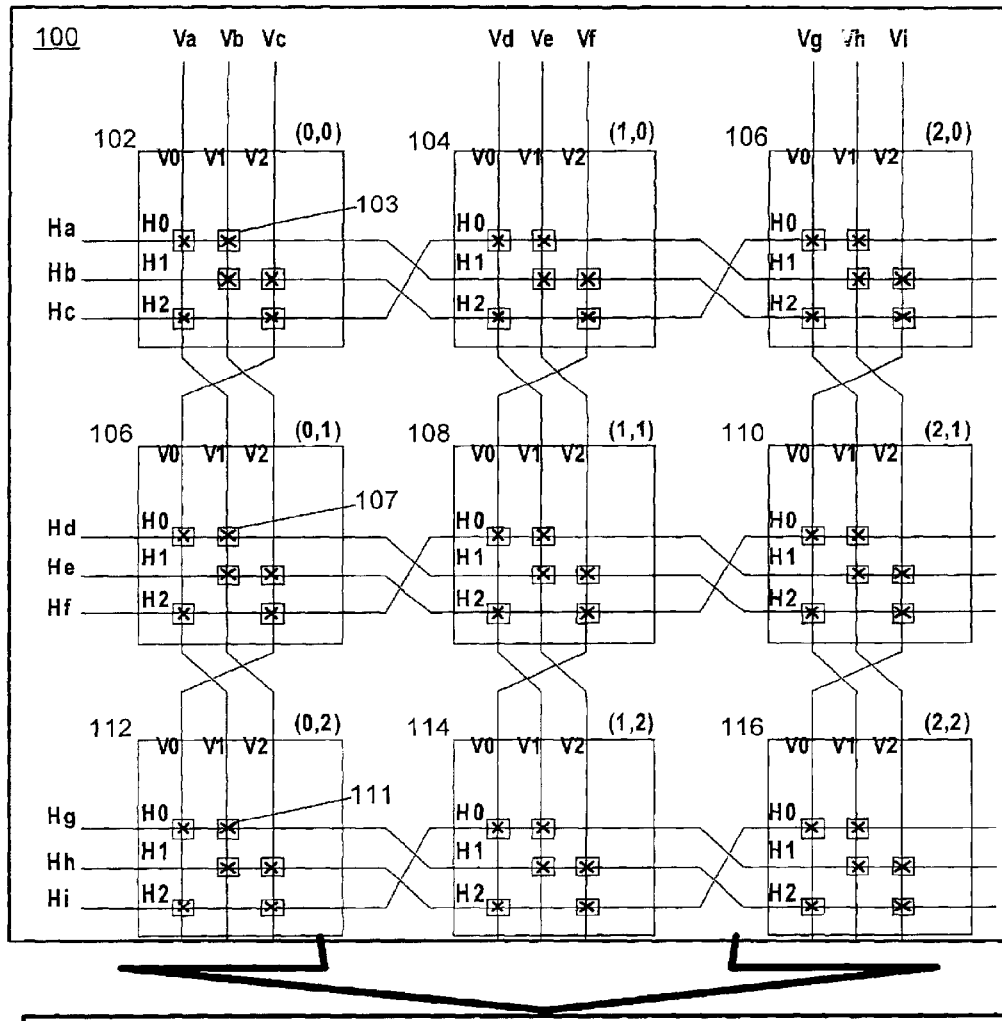
FIG. 1 is an exemplary embodiment for a computer readable medium containing a computer program for representing an electronic circuit as a routing-resource graph.

For the network 100, as shown in FIG. 1, a Flyweight design pattern is applied to the data structures representing the switches, with the extrinsic state of the switches stored in the data structures representing the wires. This results in a set of data structures that looks like a simple routing-resource graph, but uses much less memory for regular FPGAs because of the sharing of switch data structures.

A simple example of how this works is discussed with regard to the network 100 shown in FIG. 1. A single routing cell (delineated by the dashed line) is replicated to produce a routing network 100. For simplicity, function units, inputs and outputs are not shown. Cells 102–116 are labeled with (x, y) coordinates to distinguish them. Global wires Va–Vi and Ha–Hi are given local names within a cell, in this case V0, V1 and V2 for the vertical wires Va–Vi, and H0, H1 and H2 for the horizontal wires Ha–Hi. The names are local in the sense that the wire labeled V0 in cell (0, 0) is really the same wire as wire V1 in cell (0, 1). As shown in FIG. 1 there are only 9 horizontal and 9 vertical writes in the entire routing network, but because of "twists" in the wire buses between cells, each wire has a different local name in each cell in which it appears.

A representation of this network 100, requiring less memory than a typical routing-resource graph is built from the local wire codes, a table containing the switch connections, declaration of the wires in the network 100 and a couple of method calls. Each local wire name can be assigned a small integer value as shown in below.

Wire Codes

| |
|---|
| H0 = 0 |
| H1 = 1 |
| H2 = 2 |
| V0 = 3 |
| V1 = 4 |
| V2 = 5 |

A Switch Table lists the access of each wire to another wire through each of the switches in a regular block, as shown below.

Switch Table

| |
|---|
| H0 → V0, V1 |
| H1 → V1, V2 |
| H2 → V0, V2 |
| V0 → H0, H2 |
| V1 → H0, H1 |
| V2 → H1, H2 |

A declaration of the wires in the network 100 includes the actual physical (e.g. global) wires (4 horizontal and 6 vertical) in the FPGA, as shown below.

Wire Declarations

Wire verticalWires[9]={Va, Vb, Vc, Vd, Ve, Vf, Vg, Vh, Vi};

Wire horizontalWires[9]={Ha, Hb, Hc, Hd, He, Hf, Hg, Hh, Hi};

Completing the representation are Method Calls that use the Wire Codes, Switch Table, and Wire Declarations to navigate through the network 100 as shown below.

Method Calls

```
Wire localNameToHorizontalWire(Int localName, int xCell, int yCell) {
    // Assumes localName is one of H0, H1, H2
    int globalIndex = ((localName + xCell) %3) + (3 * yCell);
    return horizontalWires [globalIndex];
}
Wire localNameToVerticalWire(Int localName, int xBlock, int yBlock) {
    // Assumes localName is one of V0, V1, V2
    int globalIndex = ((localName - V0 + yCell) %3) + (3 * xCell);
    return verticalWires[globalIndex];
}
```

Exemplary embodiments combine the abstraction offered by the routing-resource graph (with its advantage of not being FPGA architecture specific) with the reduced memory usage of the compute-based approach. An exemplary Flyweight design pattern with the compute-based approach can produce a virtual routing-resource graph that appears to the router to be an ordinary routing-resource graph, but uses less memory when used to represent the routing network of an FPGA with a regular structure. The Flyweight design pattern is used in object-oriented applications where it is desirable to use objects throughout a design, straightforward implementation would use a larger memory because of large number of fine-grained objects. The pattern shares objects (e.g., a single object may be referenced in multiple contexts), with each reference to an object being treated as though it were referencing a distinct, unique object, wherein there is a difference between intrinsic and extrinsic state of an object. Intrinsic state is stored in the flyweight and is independent of the context, which makes the object shareable. Extrinsic state depends on the context in which the object is used, and is not shared or stored in the flyweight object. The application passes the extrinsic state to the flyweight when necessary. The Flyweight design pattern can thus reduce memory usage when objects can be segregated into groups, such that objects within a group can be replaced with a single, shared object (the flyweight).

The Flyweight design pattern can be applied to the objects representing the switches, with the extrinsic state of the switches stored in the objects representing the wires. The result is a set of objects that looks like a simple routing-resource graph, but uses much less memory for typical FPGAs because of the sharing of a smaller number of switch objects. For example, horizontal wires Ha, Hd and Hg are very similar in FIG. 1. Horizontal wires Hd and Hg can each be considered a simple vertical translation of Ha. This similarity suggests that the six switches on Ha could be shared by wires Hd and Hg if the state of the switches can be divided into extrinsic and intrinsic parts, and a suitable place can be found to store the extrinsic state. This can be done using the following wire and switch class definitions as shown below.

Wire Class Definition

```
// Plays the role of a node in a resource routing graph
class Wire { // extrinsic state for switches
    private int x, y; // coordinates of upper leftmost cell containing this
    wire
    private Switch[] switches; // switches that this wire drives
    public Wire(int x, int y, Switch[] switches)
        this.x = x;
        this.y = y;
        this.switches = switches;
    }
    public Switch getOutputSwitches() {
        return switches;
    }
    public int getXCoordiante() {
        return x;
    }
    public int getYCoordinate() {
        return y;
    }
}
```

Switch Class Definition

```
// Plays the role of an edge in a resource routing graph. An instance of this can be
// shared in many contexts in the graph (flyweight design pattern)
class Switch {
    private int fromWireCode; //intrinsic state for switches (H0, H1, H2, V0, ...)
    private int toWireCode; //intrinsic state for switches
    private int xOffset; //intrinsic state for switches
    private int yOffset; //intrinsic state for switches
    public Switch(int fromWire, int toWire, int xOffset, int yOffset) {
        this.fromWireCode = fromWire;
        this.toWireCode = toWire;
        this.xOffset = xOffset;
        this.yOffset = yOffset;
    }
    public Wire getDestinationWire(WiresourceWire) {set;
        int y = sourceWire.getYCoordinate() + yOffset;
        if (wireIsHorizontal(fromWireCode))
            return localNameToVerticalWire(toWireCode, x, y);
        else
            return localNameToHorizonatalWire(toWireCode, x, y);
    }
}
```

As shown above, the switch data structure includes the method call to determine a pointer to the destination wire base on information from the wire data structure.

For example, routing-resource graph objects for the switches of wires Ha, Hd and Hg could be represented like the following:

```
// Create switches (flyweights) for wire Ha
Switch[] switches = new Switch[6];
switch[0] = new Switch(H0, V0, 0, 0);
switch[1] = new Switch(H0, V1, 0, 0);
switch[2] = new Switch(H1, V1, 1, 0);
switch[3] = new Switch(H1, V2, 1, 0);
switch[4] = new Switch(H2, V0, 2, 0);
switch[5] = new Switch(H2, V2, 2, 0);
```

The routing-resource graph objects for wires Ha, Hd and Hg could then be represented as follows:
   horizontalWires[Ha]=new Wire(0, 0, switches);
   horizontalWires[Hd]=new Wire(0, 1, switches);
   horizontalWires[Hg]=new Wire(0, 2, switches);

As shown in the above exemplary representation, the wiring data structure horizontalWires[Ha] with switch information (i.e. the array "switches") and wire identity information (i.e., 0, 0) identifies a wire Ha. The wiring data structure horizontalWires[Hd] with switch information (i.e. an array "switches" that the wire drives) and wire identity information (i.e., 0, 1) identifies wire Hd. The switch data structure switch[1] has wire information (i.e., H0, V1, 0, 0) associated with horizontalWires[Ha] and horizontalWires [Hd] for identifying wire Vb connected to wire Ha with a switch as a function of the wire identity information of wire Ha and wire information from switch[1]. The switch data structure switch[1] can also identify wire Va connected to wire Hd with another switch 107 as a function of horizontalWires[Hd] and wire information from switch[1]. As referred to above, the switch information can be an array of switch data structures representing all of a plurality of switches at relative locations along a wire that are driven by the wire. The same switches having the same positions along an other wire can be represented by the same array (i.e., "switches) in the other wire's identity information.

Therefore, wires having the same switches at relative locations within blocks at the same relative positions along the wires can share arrays of switch data structures. Of course, additional extrinsic and intrinsic state, and additional methods, can be added to these classes. Also, different subclasses of the Wire class may be introduced to, for example, handle different lengths of wires in the FPGA, or to easily differentiate horizontal and vertical wires. The resulting data structures of a shared routing-resource graph model possess the abstract properties of a routing-resource graph, in that it appears there is a separate data structure or data structure for each switch and each wire, that can be implemented by a router, which routes any regular FPGA architecture. Because of the sharing of switch data structures, reduced memory can be used, if desired to store the shared routing-resource graph. Larger and more complicated FPGAs (e.g. different length wires, more complex switch patterns, etc.) than the example of FIG. 1, can of course be represented.

Figure 2:
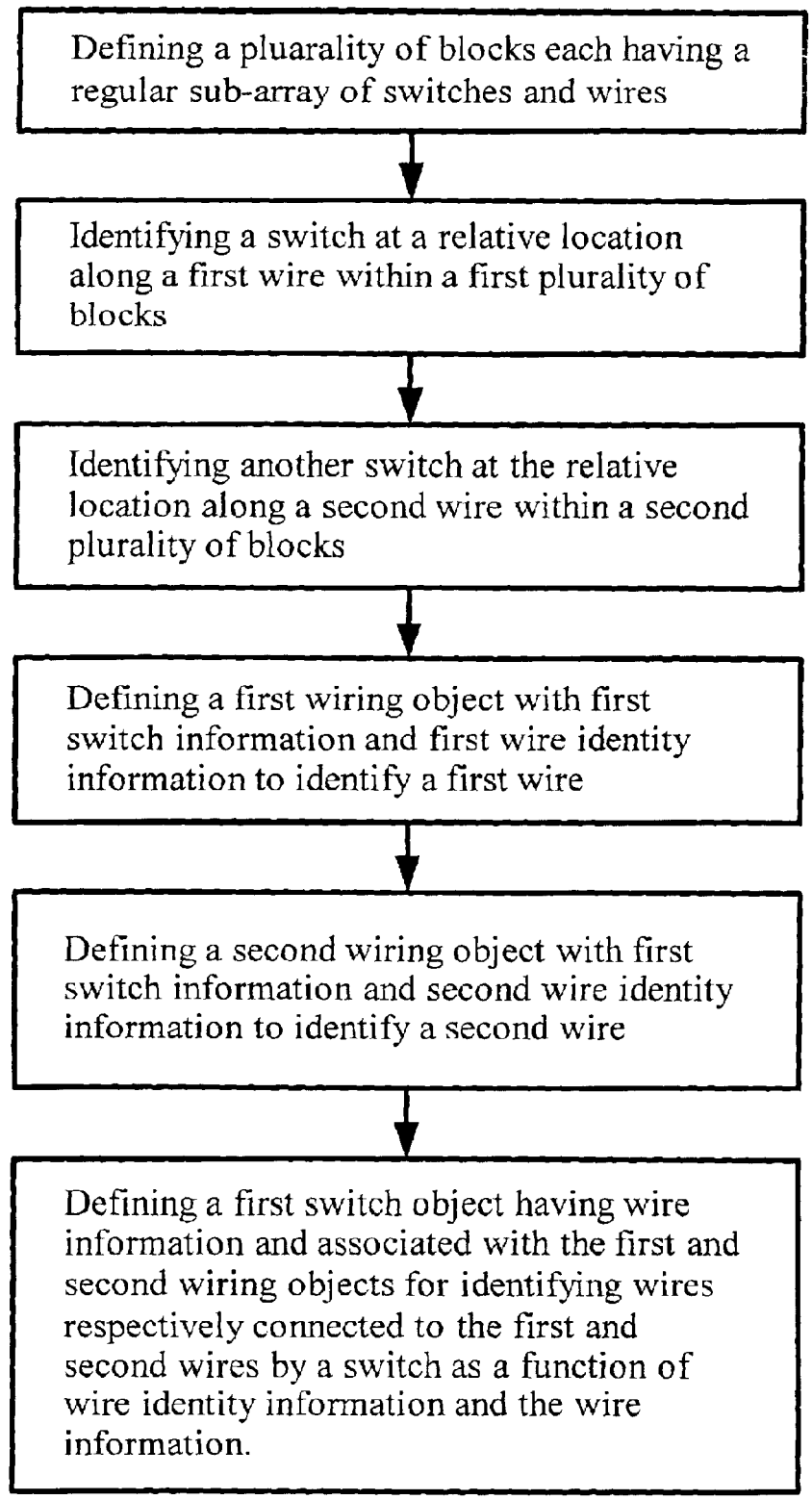
FIG. 2 is a block diagram of an exemplary embodiment for a method of describing data structure for representing an electronic circuit as a routing-resource graph.

FIG. 2 illustrates an exemplary method of describing a data structure for representing an electronic circuit as a routing-resource graph. A plurality of blocks are defined within a regular array each having a regular sub-array of switches and wires. A switch is identified at a relative location within a block at relative position along a first wire within a plurality blocks. In the example of FIG. 1, this could be the second switch on wire Ha. Another switch at the same relative location within another block at same relative position along a second wire is identified within a another plurality of blocks. In the example of FIG. 1, this could be the second switch on wire Hd. A first wiring data structure, for example horizontalWires[Ha], is defined for the first wire with first switch information and first wire identity information to identify a first wire. A second wiring data structure, for example horizontalWires[Hd], is defined for a second wire with the same first switch information and second wire identity information to identify the second wire. A switch, for example switch[1], is defined having wire information (i.e. H0, V1) and is associated with both the first and second wiring data structures for identifying wires respectively connected to the first and second wires by a switch as a function of wire identity information and the wire information.

It will be apparent to those skilled in the art that various changes and modifications can be made in the inline phase shifter of the present invention without departing from the spirit and scope thereof. Thus, it is intended that the present invention cover the modifications of this invention provided they come within the scope of the appended claims and their equivalents.

What is claimed is:

1. A method for reducing apace for holding a representation of a routing network, comprising the steps of:

generating a shared data structure for representing a group of elements in the routing network;

generating a set of unshared data structures each for representing a corresponding element in the routing network that is not included in the group;

storing a set of state information into each unshared data structure such that the state information enables the shared data structure to represent all of the elements in the group.

2. The method of claim 1, wherein the step of generating a shared data structure comprises the step of generating a shared data structure for representing a group of switches in the routing network.

3. The method of claim 2, wherein the step of generating a set of unshared data structures comprises the step of generating a set of unshared data structures each for representing a corresponding wire in the routing network.

4. The method of claim 3, wherein the step of storing a set of state information into each unshared data structure comprises the step of storing a set of state information that identifies a switch location in the routing network for the corresponding wire.

5. The method of claim 2, further comprising the step of determining the group of switches by detecting a pattern of switches along a wire of the routing network.

6. The method of claim 5, wherein the step of generating a shared data structure comprises the step of generating an array of switch data structures each corresponding to a location in the pattern.

7. The method of claim 2, further comprising the step of providing a method for determining a location in the routing network for each switch in response to the shared data structure and the state information.

8. The method of claim 1, wherein the routing network pertains to a field programmable gate array.

9. The method of claim 1, further comprising the step of constructing a routing-resource graph in response to the shared and unshared data structures.

10. A computer-readable storage medium that contains a program that when executed generates a representation of a routing network by:

generating a shared data structure for representing a group of elements in the routing network;

generating a set of unshared data structures each for representing a corresponding element in the routing network that is not included in the group;

storing a set of state information into each unshared data structure such that the state information enables the shared data structure to represent all of the elements in the group.

11. The computer-readable storage medium of claim 10, wherein generating a shared data structure comprises generating a shared data structure for representing a group of switches in the routing network.

12. The computer-readable storage medium of claim 11, wherein generating a set of unshared data structures comprises generating a set of unshared data structures each for representing a corresponding wire in the routing network.

13. The computer-readable storage medium of claim 11, wherein storing a set of state information into each unshared data structure comprises storing a set of state information that identifies a switch location in the routing network for the corresponding wire.

14. The computer-readable storage medium of claim 11, further comprising determining the group of switches by detecting a pattern of switches along a wire of the routing network.

15. The computer-readable storage medium of claim 14, wherein generating a shared data structure comprises generating an array of switch data structures each corresponding to a location in the pattern.

16. The computer-readable storage medium of claim 11, further comprising determining a location in the routing network for each switch in response to the shared data structure and the state information.

17. The computer-readable storage medium of claim 10, wherein the routing network pertains to a field programmable gate array.

18. The computer-readable storage medium of claim 10, further comprising constructing a routing-resource graph in response to the shared and unshared data structures.

* * * * *